(12) United States Patent
Jin et al.

(10) Patent No.: US 12,291,015 B2
(45) Date of Patent: May 6, 2025

(54) COLOR CONVERSION SHEET AND BACKLIGHT UNIT INCLUDING THE SAME

(71) Applicant: TORAY ADVANCED MATERIALS KOREA INC., Gumi-si (KR)

(72) Inventors: Sang Woo Jin, Gumi-si (KR); Jun Woo Park, Gumi-si (KR); Ji Whan Oh, Gumi-si (KR)

(73) Assignee: TORAY ADVANCED MATERIALS KOREA INC., Gumi-si (KR)

( * ) Notice: Subject to any disclaimer, the term of this patent is extended or adjusted under 35 U.S.C. 154(b) by 0 days.

(21) Appl. No.: 18/567,540

(22) PCT Filed: Jul. 24, 2023

(86) PCT No.: PCT/KR2023/010637
§ 371 (c)(1),
(2) Date: Dec. 6, 2023

(87) PCT Pub. No.: WO2024/039093
PCT Pub. Date: Feb. 22, 2024

(65) Prior Publication Data
US 2025/0091318 A1 Mar. 20, 2025

(30) Foreign Application Priority Data
Aug. 18, 2022 (KR) .................... 10-2022-0103474

(51) Int. Cl.
*B32B 7/02* (2019.01)
*B32B 19/02* (2006.01)
(Continued)

(52) U.S. Cl.
CPC ............... *B32B 7/02* (2013.01); *B32B 19/02* (2013.01); *B32B 27/08* (2013.01); *B32B 27/30* (2013.01);
(Continued)

(58) Field of Classification Search
CPC .......... B32B 7/02; B32B 19/02; B32B 27/08; B32B 27/30; B32B 27/32; B32B 27/36; B32B 27/40; B32B 2250/05
See application file for complete search history.

(56) References Cited

U.S. PATENT DOCUMENTS

| 2012/0156436 A1 | 6/2012 | Kim et al. |
| 2017/0017021 A1 | 1/2017 | Tokinoya et al. |

(Continued)

FOREIGN PATENT DOCUMENTS

| JP | 2017-24292 A | 2/2017 |
| JP | 2021-100031 A | 7/2021 |

(Continued)

OTHER PUBLICATIONS

Korean Office Action issued on Jul. 15, 2024, in counterpart Korean Patent Application No. 10-2022-0103474 (7 pages in English, 7 pages in Korean).

(Continued)

*Primary Examiner* — Betelhem Shewareged
(74) *Attorney, Agent, or Firm* — NSIP Law

(57) ABSTRACT

A color conversion sheet according to the present invention includes a first wavelength conversion layer in which an organic phosphor is dispersed in a resin matrix, a first phosphor diffusion barrier layer positioned on one surface of the first wavelength conversion layer, and an adhesive layer positioned on one surface of the first phosphor diffusion barrier layer, wherein a Hildebrand solubility parameter of the first phosphor diffusion barrier layer satisfies a predetermined relationship between a Hildebrand solubility parameter of the resin matrix of the first wavelength conversion layer and a Hildebrand solubility parameter of a solvent contained in the first phosphor diffusion barrier (Continued)

layer, thereby resolving problems of changes in luminance characteristics and color change.

14 Claims, 2 Drawing Sheets

(51) Int. Cl.
    *B32B 27/08*     (2006.01)
    *B32B 27/30*     (2006.01)
    *B32B 27/32*     (2006.01)
    *B32B 27/36*     (2006.01)
    *B32B 27/40*     (2006.01)

(52) U.S. Cl.
    CPC .............. *B32B 27/32* (2013.01); *B32B 27/36* (2013.01); *B32B 27/40* (2013.01); *B32B 2250/05* (2013.01)

(56) References Cited

U.S. PATENT DOCUMENTS

| | | |
|---|---|---|
| 2020/0088920 A1 | 3/2020 | Sakaino et al. |
| 2020/0230915 A1 | 7/2020 | Kurokawa |
| 2021/0317363 A1 | 10/2021 | Jin et al. |

FOREIGN PATENT DOCUMENTS

| | | | |
|---|---|---|---|
| JP | 6939787 B2 | 9/2021 | |
| JP | 2021-533404 A | 12/2021 | |
| KR | 10-2012-0067167 A | 6/2012 | |
| KR | 10-2016-0140717 A | 12/2016 | |
| KR | 10-2038228 B1 | 10/2019 | |
| KR | 10-2020-0012851 A | 2/2020 | |
| KR | 10-2020-0066330 A | 6/2020 | |
| WO | WO-2020027375 A1 * | 2/2020 | ............. B32B 27/08 |

OTHER PUBLICATIONS

International Search Report No. PCT/KR2023/010637 issued on Nov. 23, 2023 (3 Pages in Korean).

Japanese Office Action issued on Nov. 26, 2024, in counterpart Japanese Patent Application No. 2023-556518 (7 pages in English, 7 pages in Japanese).

Extended European search report issued on Sep. 26, 2024, in counterpart European Patent Application No. 23764547.8 (6 pages).

* cited by examiner

COLOR CONVERSION SHEET AND BACKLIGHT UNIT INCLUDING THE SAME

CROSS REFERENCE TO RELATED APPLICATIONS

This application is a U.S. National Stage Application of International Application No. PCT/KR2023/010637, filed on Jul. 24, 2023, which claims the benefit under 35 USC 119 (a) and 365(b) of Korean Patent Application No. 10-2022-0103474, filed on Aug. 18, 2022, in the Korean Intellectual Property Office, the entire disclosure of which is incorporated herein by reference for all purposes.

TECHNICAL FIELD

The present invention relates to a color conversion sheet using an organic phosphor and a backlight unit including the same, and more specifically, to a color conversion sheet exhibiting low color change and excellent luminance reliability by preventing the deterioration of an organic phosphor, and a backlight unit including the same.

BACKGROUND ART

Conventionally, a liquid crystal display (LCD) device is a non-emissive display device that itself does not emit light and thus cannot form an image and rather requires external light to be incident upon them in order to form an image. Thus, a backlight unit (BLU) to emit light is required on a rear surface of the LCD devices. Recently, quantum dot technology has been widely applied to achieve high-quality images in LCDs. This technology offers the advantage of producing a wide range of colors by simply adjusting the size of nano-sized inorganic particles, and it also exhibits excellent stability against light such as ultraviolet (UV).

However, in the case of liquid crystal display devices utilizing quantum dot technology, the use of cadmium (Cd)-based nano-sized inorganic particles has been a common practice. These cadmium-based nano-sized inorganic particles raise environmental concerns, and their vulnerability to moisture requires the use of barrier films. As a result, selection of a substrate and combination with other optical films are limited due to these disadvantages.

Consequently, there has been considerable development in organic phosphors that can achieve wide color gamut and excellent brightness characteristics without including cadmium-based nano-sized inorganic particles. Organic phosphors offer superior luminescence efficiency compared to nano-sized inorganic particles applied to quantum dot technology and can exhibit a variety of luminescent properties even with the same phosphor through changes in the surrounding chemicals. Moreover, organic phosphors are relatively resistant to moisture, eliminating the need for barrier films and facilitating the use of various substrates and combinations with other optical films.

However, organic phosphors may be deteriorated due to chemical or physical reactions with adjacent materials. This deterioration could lead to reduced photodurability, which poses challenges when applying organic phosphors to displays. Thus, there is an urgent need for technology development to address this issue.

PRIOR ART LITERATURE

Patent Literature (Patent Document 001) Korean Patent Publication No. 10-2012-0067167

DETAILED DESCRIPTION OF THE INVENTION

Technical Problem

The present invention is conceived to solve the aforementioned problems in the prior art. Thus, an object of the present invention is to provide a color conversion sheet which has excellent color gamut and luminance characteristics while employing an environmentally safe organic phosphor by preventing an organic phosphor contained in a wavelength conversion layer from chemically reacting with and diffusing into an adjacent layer, and exhibits low color change and excellent luminance reliability upon irradiation of light at room temperature and even in an environment of high temperature and high humidity, and a backlight unit including the same.

The above and other objects and advantages of the present invention will become more apparent from the following description of preferred embodiments.

Technical Solution

The above object may be achieved by a color conversion sheet including a first wavelength conversion layer in which an organic phosphor is dispersed in a resin matrix, a first phosphor diffusion barrier layer positioned on one surface of the first wavelength conversion layer, and an adhesive layer positioned on one surface of the first phosphor diffusion barrier layer, wherein the first phosphor diffusion barrier layer is formed from a composition containing a solvent having a Hildebrand solubility parameter according to Equation 1 below:

$$|P1-S2|>2 \text{ MPa}^{1/2} \quad \text{(Equation 1)}$$

P1: Hildebrand solubility parameter of the resin matrix of the first wavelength conversion layer S2: Hildebrand solubility parameter of the solvent included in the first phosphor diffusion barrier layer.

Preferably, the first phosphor diffusion barrier layer may further include a thermosetting or thermoplastic organic compound that has a Hildebrand solubility parameter according to Equation 2 below:

$$|P1-P2|>2 \text{ MPa}^{1/2} \quad \text{(Equation 2)}$$

P1: Hildebrand solubility parameter of the resin matrix of the first wavelength conversion layer P2: Hildebrand solubility parameter of the organic compound included in the first phosphor diffusion barrier layer.

Preferably, the thickness of the first phosphor diffusion barrier layer may be 0.01 to 10 μm.

Preferably, the color conversion sheet may have a color coordinate change on both x-axis and y-axis within ±0.0015 after treatment for 480 hours at 70° C.

Preferably, the resin matrix may contain at least one of an ester-based resin, an olefin-based resin, an acrylic-based resin, an ether-based resin, a urethane-based resin, a carbonate-based resin, or an imide-based resin.

Preferably, the resin matrix may have a glass transition temperature of 50 to 140° C.

Preferably, the organic phosphor of the first wavelength conversion layer may not migrate into the phosphor diffusion barrier layer.

Preferably, the first phosphor diffusion barrier layer may have a visible light transmittance of 70% or more.

Preferably, the color conversion sheet may further include a substrate positioned on at least one surface of the first wavelength conversion layer or the adhesive layer.

Preferably, the color conversion sheet may further include a second phosphor diffusion barrier layer positioned on the adhesive layer and a second wavelength conversion layer positioned on the second phosphor diffusion barrier layer and having an organic phosphor dispersed in a resin matrix.

Preferably, the second wavelength conversion layer may contain an organic phosphor having the same or different color as that of the organic phosphor dispersed in the first wavelength conversion layer.

Preferably, the second phosphor diffusion barrier layer may be formed from a composition containing a solvent having a Hildebrand solubility parameter according to Equation 1 below:

$$|P1-S2|>2 \text{ MPa}^{1/2} \qquad \text{(Equation 1)}$$

P1: Hildebrand solubility parameter of the resin matrix of the second wavelength conversion layer S2: Hildebrand solubility parameter of the solvent included in the second phosphor diffusion barrier layer.

Preferably, the second phosphor diffusion barrier layer may further include a thermosetting or thermoplastic organic compound that has a Hildebrand solubility parameter according to Equation 2 below:

$$|P1-P2|>2 \text{ MPa}^{1/2} \qquad \text{(Equation 2)}$$

P1: Hildebrand solubility parameter of the resin matrix of the second wavelength conversion layer P2: Hildebrand solubility parameter of the organic compound included in the second phosphor diffusion barrier layer.

The above object may be achieved by a backlight unit including the color conversion sheet described above.

Advantageous Effects

As described above, according to the color conversion sheet and a backlight unit including the same in accordance with an embodiment of the present invention, the color conversion sheet is further provided with a phosphor diffusion barrier layer for preventing diffusion of an organic phosphor, which is formed on one surface of the wavelength conversion layer in which the organic phosphor is dispersed. Accordingly, it is possible to prevent deterioration of the organic phosphors within the wavelength conversion layer due to unnecessary elements such as moisture and oxygen in the air when the wavelength conversion layer is exposed to the outside, thereby addressing problems such as color coordinate change or degradation in reliability.

In addition, according to a color conversion sheet and a backlight unit including the same in accordance with an embodiment of the present invention, the phosphor diffusion barrier layer may prevent unnecessary contact with the adhesive layer, which is used for laminating the wavelength conversion layer with various substrate films and/or another wavelength conversion layer, which makes it possible to prevent deterioration of the organic phosphor within the wavelength conversion layer due to chemical functional groups of the adhesive layer. Also, it is possible to prevent the organic phosphors of the wavelength conversion layer from diffusing) into the adhesive layer under high-temperature or high temperature/high humidity conditions, thereby resolving problems of changes in luminance characteristics and color change.

In addition, a color conversion sheet and a backlight unit including the same according to an embodiment of the present invention can not only be combined with optical substrate such as light guide plates, prism sheets, and brightness enhancement films (DBEF), but they are also applicable to various organic phosphors and resin matrices. Additionally, the omission of a barrier film enhances cost competitiveness.

However, the effects of the present invention are not limited to the effects mentioned above, and other effects not mentioned will be clearly understood by those skilled in the art from the description below.

MODE FOR INVENTION

Figure 1:
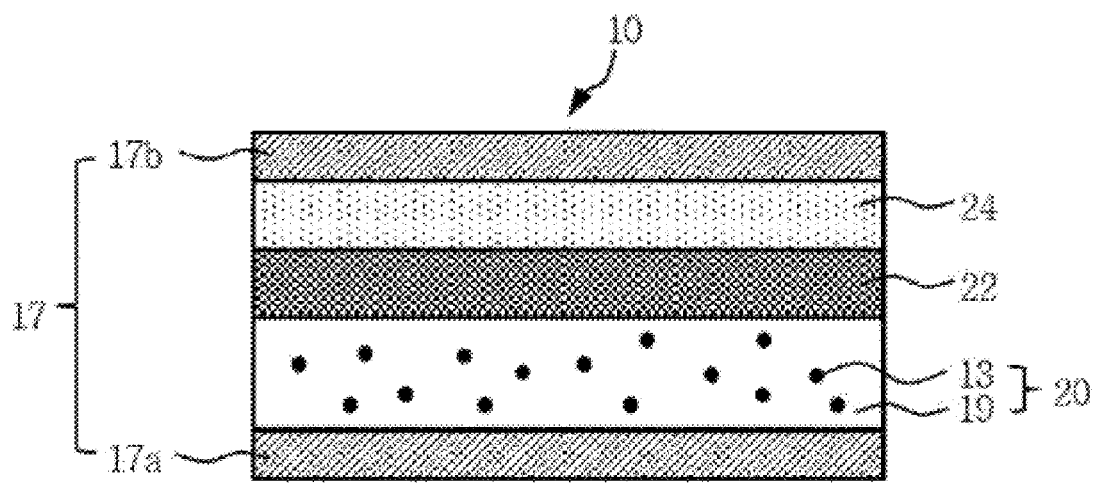
FIG. 1 is a view showing a configuration of a color conversion sheet according to an embodiment of the present invention.

Hereinafter, embodiments of the present invention will be described in detail with reference to the accompanying drawings so as to be easily practiced by a person of ordinary skill in the art. It should be, however, understood that the present invention is not to be construed as limited to the embodiments set forth herein and may be embodied in many different forms.

In the drawings, the thickness of layers and regions are exaggerated for clarity. Like reference numerals designate like elements throughout the specification. It will be understood that when an element such as a layer, film, region or substrate is referred to as being "on" another element, it can be directly on the other element or intervening elements may also be present. In contrast, when an element is referred to as being "directly on" another element, there are no intervening elements present.

Unless otherwise defined, all technical and scientific terms used herein have the same meaning as commonly understood by one of ordinary skill in the art to which this invention belongs. In case of conflict, the specification, including definitions, will control. In addition, although methods and materials similar or equivalent to those described herein can be used in the practice or testing of the invention, suitable methods and materials are described herein.

Hereinafter, a color conversion sheet according to an embodiment of the present invention will be described in detail with reference to the drawings.

FIG. 1 is a view showing a configuration of a color conversion sheet according to an embodiment of the present invention.

Referring to FIG. 1, a color conversion sheet 10 according to an embodiment of the present invention includes a wavelength conversion layer 20 formed by dispersing an organic phosphor in a resin matrix, a phosphor diffusion barrier layer 22 located on one surface of the wavelength conversion layer 20, and an adhesive layer 24 located on one surface of the phosphor diffusion barrier layer 22.

The phosphor diffusion barrier layer 22 is positioned between the wavelength conversion layer 20 and the adhesive layer 24 and is characterized by preventing an organic phosphor 13 dispersed in the wavelength conversion layer 20 from diffusing into the adhesive layer 24. Here, the phosphor diffusion barrier layer 22 not only prevent deterioration of the organic phosphor 13 within the wavelength conversion layer 20 due to unwanted elements such as moisture and oxygen in the air when the wavelength conversion layer 20 is exposed to the outside, but also serves to prevent deterioration of the organic phosphor 13 caused by chemical functional groups in other adjacent layers due to unnecessary contact with other adjacent layers, such as the adhesive layer 24.

That is, the phosphor diffusion barrier layer 22 is situated between the wavelength conversion layer 20 and the adhesive layer 24, preventing the organic phosphor 13 within the wavelength conversion layer 20 from deteriorating due to the chemical functional groups of the adhesive layer 24 or residual solvents. Simultaneously, it prevents the organic phosphor 13 detached from the interface of the wavelength conversion layer 20 over time in an environment of high-temperature or high-temperature and high-humidity, from diffusing into the adhesive layer 24, thereby averting changes in the luminous efficiency of the organic phosphor caused by change in the distance between the organic phosphors due to such diffusion. Ultimately, the phosphor diffusion barrier layer 22 plays a role in preventing color coordinate changes or a decrease in reliability of light emitted by a color conversion sheet. Therefore, the color conversion sheet 10 equipped with the phosphor diffusion barrier layer 22 prevents the diffusion of the organic phosphors 13 from the wavelength conversion layer 20 to other layers or their migration due to interlayer mixing, maintaining a consistent distance between organic phosphors 13, thereby achieving high color uniformity, uniform brightness, and high reliability even in various environments.

In the color conversion sheet 10 according to an embodiment of the present invention, the phosphor diffusion barrier layer 22 may be formed on one surface of the wavelength conversion layer 20 through a coating or printing method. In this case, the phosphor diffusion barrier layer 22 should not affect the wavelength conversion layer 20. In other words, it is not preferable for the phosphor diffusion barrier layer 22 to contain solvents or organic compounds that can dissolve the wavelength conversion layer 20 or be mixed with it.

Therefore, it is preferable for the phosphor diffusion barrier layer 22 to be formed from a composition containing a solvent that satisfies Equation 1 below. In this case, any solvent that satisfies Equation 1 can be applied.

$$|P1-S2|>2 \text{ MPa}^{1/2} \qquad \text{(Equation 1)}$$

P1: Hildebrand solubility parameter ($MPa^{1/2}$) of the resin matrix of the wavelength conversion layer S2: Hildebrand solubility parameter ($MPa^{1/2}$) of the solvent included in the phosphor diffusion barrier layer The Hildebrand solubility parameter of Equation 1 may be found using the Polymer Handbook.

It is preferable for the difference in solubility parameters between the resin matrix included in the wavelength conversion layer 20 and the solvent included in the phosphor diffusion barrier layer 22 to exceed 2 $MPa^{1/2}$ as shown in Equation 1, and it is even more preferable for it to be greater than or equal to 4 $MPa^{1/2}$. This is because if the difference in solubility parameters between these two is not sufficient (less than or equal to 2 $MPa^{1/2}$), the solvent in the phosphor diffusion barrier layer 22 may dissolve the wavelength conversion layer 20, causing the organic phosphors 13 within the wavelength conversion layer 20 to diffuse or move into the phosphor diffusion barrier layer 22.

Further, it is preferable for the phosphor diffusion barrier layer 22 to be formed from a composition containing a thermosetting or thermoplastic organic compound that satisfies Equation 2 below. In this case, the organic compound may be preferably at least one of single molecules, oligomers, or resins. Any organic compound that satisfies Equation 2 can also be applied.

$$|P1-P2|>2 \text{ MPa}^{1/2} \qquad \text{(Equation 2)}$$

P1: Hildebrand solubility parameter ($MPa^{1/2}$) of the resin matrix of the wavelength conversion layer P2: Hildebrand solubility parameter ($MPa^{1/2}$) of the organic compound included in the phosphor diffusion barrier layer It is preferable for the difference in solubility parameters between the resin matrix included in the wavelength conversion layer 20 and the organic compound included in the phosphor diffusion barrier layer 22 to exceed 2 $MPa^{1/2}$ as shown in Equation 2, and it is even more preferable for it to be greater than or equal to 4 $MPa^{1/2}$. This is because if the difference in solubility parameters between the resin matrix 19 of the wavelength conversion layer 20 and the organic compound of the phosphor diffusion barrier layer 22 is not sufficient (less than or equal to 2 $MPa^{1/2}$), the phosphor diffusion barrier layer 22 may, over time in an environment of high-temperature or high-temperature and high-humidity, become mixed with the wavelength conversion layer 20 or the organic phosphors 13 may be detached from the interface of the wavelength conversion layer 20 and diffuse or move into the phosphor diffusion barrier layer 22.

In addition, the thickness of the phosphor diffusion barrier layer 22 is preferably 0.01 to 10 μm, and more preferably 0.01 to 5 μm, and even more preferably 0.01 to 2 μm. This is because when the thickness of the phosphor diffusion barrier layer 22 is less than 0.01 μm, the diffusion barrier function for the organic phosphors 13 in an environment of high-temperature or high-temperature and high-humidity may be compromised, making it difficult to control color changes that may occur due to the diffusion of the organic phosphors 13. On the other hand, when the thickness of the phosphor diffusion barrier layer 22 exceeds 10 μm, it may lead to reduced light transmission efficiency, and inadequate coating due to differences in solubility between the wavelength conversion layer 20 and the solvent and organic compounds of the diffusion barrier layer 22.

It is preferable that the phosphor diffusion barrier layer 22 has a refractive index different from that of the wavelength conversion layer 20. For example, in the case where incident light finally exits through the wavelength conversion layer 20, the refractive index of the phosphor diffusion barrier layer 22 may be preferably greater than that of the wavelength conversion layer 20. This is because increasing the light reflectance of the phosphor diffusion barrier layer 22 effectively facilitates the emission of the finally color-converted light to the outside.

In one embodiment, the phosphor diffusion barrier layer 22 does not include organic phosphors 13 detached from the wavelength conversion layer 20. As described above, in the present invention, the phosphor diffusion barrier layer 22 satisfies Equations 1 and 2, ensuring that the organic phosphors 13 of the wavelength conversion layer 20 do not detach or diffuse into the phosphor diffusion barrier layer 22.

Therefore, the phosphor diffusion barrier layer 22 does not contain the organic phosphors 13 detached from the wavelength conversion layer 20, resulting in high optical reliability.

In one embodiment, it is preferable for the phosphor diffusion barrier layer 22 not to reduce the intensity of light emitted from the organic phosphor 13 of the wavelength conversion layer 20. Therefore, the phosphor diffusion barrier layer 22 preferably has a visible light transmittance of 70% or more, more preferably 80% or more, and even more preferably 90% or more. If the visible light transmittance of the phosphor diffusion barrier layer 22 is less than 70%, the intensity of the light generated when the organic phosphor 13 in the wavelength conversion layer 20 is emitted by incident light may be reduced, leading to decreased efficiency of the color conversion sheet.

In one embodiment, the wavelength conversion layer 20 includes the resin matrix 19 and the organic phosphor 13 dispersed in the resin matrix 19.

The resin matrix 19 preferably includes at least one of an ester-based resin, an olefin-based resin, an acrylic-based resin, an ether-based resin, a urethane-based resin, a carbonate-based resin, or an imide-based resin.

The resin matrix 19 serves to prevent deterioration of the organic phosphor 13 dispersed in the resin matrix 19 by immobilizing the organic phosphor 13 in the wavelength conversion layer while preventing exposure to moisture or oxygen.

In addition, the resin contained in the resin matrix 19 preferably has a number average molecular weight (Mn) of 1,000 to 50,000 g/mol or a weight average molecular weight (Mw) of 50,000 to 2,000,000 g/mol. This is because if the number average molecular weight of the resin contained in the resin matrix 19 is less than 1,000 g/mol or the weight average molecular weight is less than 50,000 g/mol, it is difficult to immobilize the organic phosphors 13, which may lead to temperature-induced aggregation of the organic phosphors 13 and subsequent deterioration of their optical properties. On the other hand, if the number average molecular weight exceeds 50,000 g/mol or the weight average molecular weight exceeds 2,000,000 g/mol, the resin matrix 19 may have poor solubility in the solvent, making it challenging to form the wavelength conversion layer 20.

In addition, the acid value of the resin contained in the resin matrix 19 may be 0 to 15 mgKOH/g, and preferably 0 to 10 mgKOH/g. Also, the hydroxyl value of the resin contained in the resin matrix 19 may be 0 to 30 mgKOH/g, preferably 0 to 20 mgKOH/g, and more preferably 0 to 10 mgKOH/g. In general, ester-based resins, olefin-based resins, acrylic-based resins, ether-based resins, urethane-based resins, carbonate-based resins, and imide-based resins can be applied as the resin matrix 19 for the wavelength conversion layer 20 included in the color conversion sheet, and functional groups, such as hydroxyl groups or carboxylic acid groups, present in these resins accelerate the deterioration of the organic phosphors 13 dispersed in the resin matrix, which may reduce the reliability of the organic phosphors 13. Therefore, it is preferable to keep the acid value and hydroxyl value in the aforementioned range.

The resin of the resin matrix 19 may include at least one of polyester, modified polyester, polyethylene, polycycloolefin, poly(methyl) methacrylate, polyethylene glycol, polyurethane, polycarbonate, or polyimide, and may include block copolymers thereof.

In addition, the resin matrix 19 may have a glass transition temperature (Tg) of 50° C. to 140° C., preferably 60° C. to 140° C., and more preferably 70° C. to 140° C. When the glass transition temperature of the resin matrix 19 is less than 50° C., aggregation of the plurality of organic phosphors 13 may occur over time in an environment of high temperature or high temperature and high humidity, leading to deterioration in optical characteristics, and when the glass transition temperature exceeds 140° C., the resin may have poor solubility in a solvent due to high crystallinity of the resin in general, and curling of a substrate-film may occur due to crystallization of the resin when drying after coating the substrate film with the resin.

In one embodiment, the organic phosphor 13 dispersed in the resin matrix 19 of the wavelength conversion layer 20 is a phosphor that emits light of a different wavelength from that of excitation light upon irradiation of the excitation light. The wavelength conversion layer 20 may include a single green or red phosphor depending on the objective, or it may emit light of various colors through combinations of green and red phosphors. Within the single wavelength conversion layer 20, a plurality of the same-colored organic phosphors 13 may be included, emitting the same color, wherein the plurality of organic phosphors may be of the same material or different materials.

For example, the wavelength conversion layer 20 may include only one organic phosphor from among a plurality of green organic phosphors or a plurality of red organic phosphors to emit only one color of light, and when an organic phosphor of one color is used in one wavelength conversion layer, two or more wavelength conversion layers 20 each including an organic phosphor of a different color may be separately provided to emit light of various colors.

In another embodiment, a mixture of a plurality of organic phosphors 13 of two or more different colors may be included in one wavelength conversion layer 20, wherein the plurality of organic phosphors 13 may be of the same material or different materials. For example, the wavelength conversion layer 20 may include a mixture of a green organic phosphor and a red organic phosphor.

The organic phosphor 13 may include compounds having a condensed aryl ring, such as naphthalene, anthracene, phenanthrene, pyrene, chrysene, triphenylene, perylene, fluoranthene, fluorene, indene, etc., or derivatives thereof (e.g., 2-(benzothiazol-2-yl)-9,10-diphenylanthracene 5,6,11,12-tetraphenylnaphthacene, etc.), compounds having a heteroaryl ring such as furan, pyrrole, thiophene, silol, 9-silafluorene, 9,9'-spirobisilafluorene, benzothiophene, benzofuran, indole, dibenzothiophene, dibenzofuran, imidazopyridine, phenanthroline, pyridine, pyrazine, naphthyridine, quinoxaline, pyrrolopyridine, thioxanthene, etc., or derivatives thereof, borane derivatives, distyrylbenzene derivatives, aminostyryl derivatives, such as 4,4'-bis(2-(4-diphenylaminophenyl) ethenyl) biphenyl, 4,4'-bis(N-(stilben-4-yl)-N-phenylamino) stilbene, etc., aromatic acetylene derivatives, tetraphenyl butadiene derivatives, stilbene derivatives, aldazine derivatives, pyromethene derivatives, coumarin derivatives, such as diketopyrrolo[3,4-c]pyrrole derivatives, 2,3,5,6-1H,4H-tetrahydro-9-(2'-benzothiazolyl) quinolizino[9,9a,1-gh]coumarin, etc., azole derivatives and metal complexes thereof, such as imidazole, thiazole, thiadiazole, carbazole, oxazole, oxadiazole, triazole, etc., and aromatic amine derivatives represented by N,N'-diphenyl-N,N'-di(3-methylphenyl)-4,4'-diphenyl-1,1'-diamine.

As the organic phosphor 13 according to one embodiment of the present invention, the green organic phosphor may preferably include a compound represented by Formula 1 below, and the red organic phosphor may preferably include a compound represented by Formula 2 below.

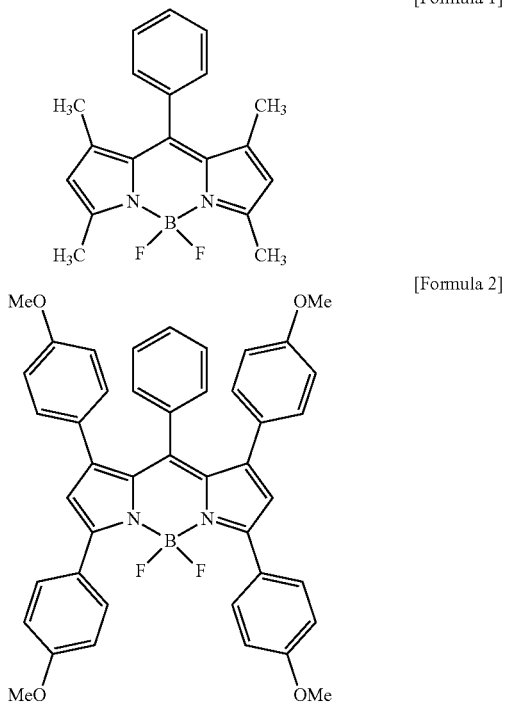

[Formula 1]

[Formula 2]

The wavelength conversion layer 20 preferably contains 0.0001 to 10 parts by weight of the organic phosphor 13 based on 100 parts by weight of resin solid content of the resin matrix 19. When the organic phosphor 13 is contained in an amount of less than 0.0001 parts by weight, color conversion to a desired color through the color conversion sheet 10 may be insufficient, and when its amount exceeds 10 parts by weight, quenching may occur due to interactions, such as aggregation of the organic phosphors 13.

The thickness of the wavelength conversion layer 20 including the organic phosphor 13 dispersed in the resin matrix 19 is preferably 1 to 150 μm, preferably 1 to 100 μm, and more preferably 1 to 50 μm. When the thickness of the wavelength conversion layer 20 exceeds 150 μm, it is difficult to sufficiently remove solvents, which may lead to deterioration of the organic phosphor 13 due to various solvents that may remain within the wavelength conversion layer 20.

In one embodiment, a substrate 17 may be further included as necessary on at least one surface of the wavelength conversion layer 20 or the adhesive layer 24 in contact with the outside. That is, the substrate 17 may be further included on one surface of the wavelength conversion layer on which the adhesive layer 24 is not formed and/or on one surface of the adhesive layer 24 on which the wavelength conversion layer 20 is not formed. For example, as shown in FIG. 1, a first substrate 17a may be positioned on the surface of the wavelength conversion layer 20 while a second substrate 17b may be positioned on the surface of the adhesive layer 24, thereby protecting and supporting the color conversion sheet from the outside.

The substrate 17 may be a transparent and flexible polymer film. For example, the substrate 17 may be a polymer film of a polyethylene terephthalate (PET), polyethylene naphtalate, polyacrylate, polycarbonate, polyetherimide, or polyimide, but is not limited thereto, and various polymer films may be applied.

Here, the substrate 17 may be a diffusion sheet, a prism sheet, or the like, but is not limited thereto, and a sheet having various functions may be applied.

In the case where the substrate 17 is adhered to the phosphor diffusion barrier layer 22 through the adhesive layer 24, that is, where the substrate 17 is laminated on one surface of the adhesive layer 24, the adhesive strength of the adhesive layer 24 to the substrate 17 and the adhesive strength of the adhesive layer 24 to the phosphor diffusion barrier layer 22 may be preferably 50 gf/inch or more. When the adhesive strength is less than 50 gf/inch, it may be difficult to fix the laminated structure of the color conversion sheet 10.

The color conversion sheet according to the above description preferably exhibits color coordinate changes within +0.0015 for both the x-axis and y-axis after undergoing treatment at a temperature of 70° C. for 480 hours. If the color coordinate changes exceed ±0.0015, issues related to luminance characteristics and color change may arise.

Figure 2:
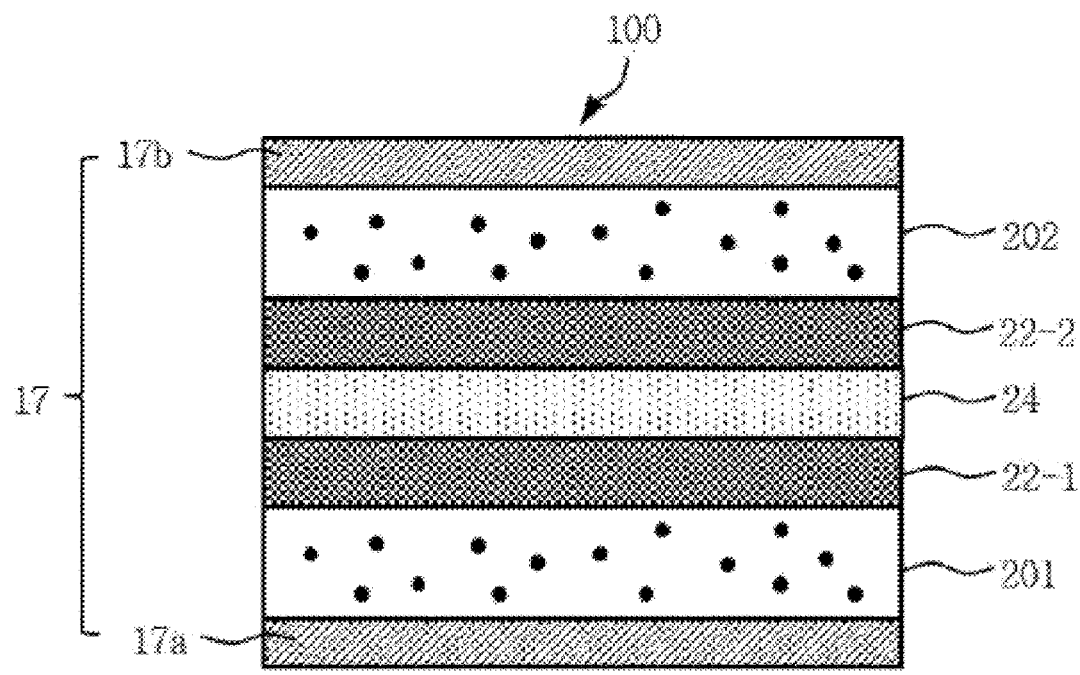
FIG. 2 is a view showing a configuration of a color conversion sheet according to another embodiment of the present invention.

Next, a color conversion sheet according to another embodiment of the present invention is described with reference to FIG. 2. FIG. 2 is a view showing a configuration of a color conversion sheet according to another embodiment of the present invention.

Referring to FIG. 2, in a color conversion sheet 100 according to another embodiment of the present invention, as shown in FIG. 2, phosphor diffusion barrier layers 22-1 and 22-2 are formed on both sides of the adhesive layer 24, a first wavelength conversion layer 201 and a second wavelength conversion layer 202 are formed respectively on surfaces of the phosphor diffusion barrier layers 22-1 and 22-2 where the adhesive layer 24 is not positioned, and the substrate 17 may be formed on the outer surfaces of the first wavelength conversion layer 201 and the second wavelength conversion layer 202 as needed. That is, in the example shown in FIG. 2, the color conversion sheet 100 has a structure where, around the adhesive layer 24, the first phosphor diffusion barrier layer 22-1 and the first wavelength conversion layer 201 are sequentially positioned below the adhesive layer 24, and the second phosphor diffusion barrier layer 22-2 and the second wavelength conversion layer 202 are sequentially positioned above the adhesive layer 24.

Hereinafter, descriptions redundant with those provided with reference to FIG. 1 which illustrates the color conversion sheet 10 according to one embodiment of the present invention will be omitted.

As described above in FIG. 1, in the color conversion sheet 100 according to another embodiment of the present invention of FIG. 2, the second phosphor diffusion barrier layer 22-2 is preferably formed from a composition containing a solvent having a Hildebrand solubility parameter according to Equation 1 below:

$$|P1-S2|>2 \text{ MPa}^{1/2} \quad \text{(Equation 1)}$$

P1: Hildebrand solubility parameter of the resin matrix of the second wavelength conversion layer S2: Hildebrand solubility parameter of the solvent included in the second phosphor diffusion barrier layer.

Further, the second phosphor diffusion barrier layer 22-2 is preferably formed from a composition further containing a thermosetting or thermoplastic organic compound that has a Hildebrand solubility parameter according to Equation 2 below:

$$|P1-P2|>2 \text{ MPa}^{1/2} \quad \text{(Equation 2)}$$

P1: Hildebrand solubility parameter of the resin matrix of the second wavelength conversion layer P2: Hildebrand solubility parameter of the organic compound included in the second phosphor diffusion barrier layer.

In addition, the first wavelength conversion layer 201 and the second wavelength conversion layer 202 may each contain an organic phosphor 13 of a different color. When a mixture of organic phosphors of different colors is used in one wavelength conversion layer, deterioration may occur due to a reaction between different organic phosphors, or a change in color coordinates may occur due to a change in distance between different organic phosphors. Thus, the organic phosphors of different colors may be separated into the individual wavelength conversion layers 201 and 202 to prepare the color conversion sheet 100. Here, the composition of the resin matrix and the organic phosphor included in the first wavelength conversion layer 201 and the second wavelength conversion layer 202 are the same as the composition of FIG. 1 described above.

For example, the color conversion sheet 100 may be prepared by mixing a green organic phosphor into the first wavelength conversion layer 201 according to Formula 1 and mixing a red organic phosphor into the second wavelength conversion layer 202 according to Formula 2.

The phosphor diffusion barrier layers 22-1 and 22-2 prevent the organic phosphors of the first wavelength conversion layer 201 and the second wavelength conversion layer 202 from diffusing into the adhesive layer 24 or mixing with each other by diffusion. In this case, the phosphor diffusion barrier layers 22-1 and 22-2 preferably satisfy the above-described Equations 1 and 2 with respect to both the first wavelength conversion layer 201 and the second wavelength conversion layer 202.

Additionally, the first phosphor diffusion barrier layer 22-1, the adhesive layer 24, and the second phosphor diffusion barrier layer 22-2 maintain a certain distance (spacing) between the first wavelength conversion layer 201 and the second wavelength conversion layer 202, thereby ensuring consistent emission efficiency of the red organic phosphor. Accordingly, it is possible to prevent degradation in color coordinates and reliability of the white light emitted by the color conversion sheet 100.

Next, a backlight unit including a color conversion sheet according to one embodiment of the present invention is described with reference to FIG. 3.

Figure 3:
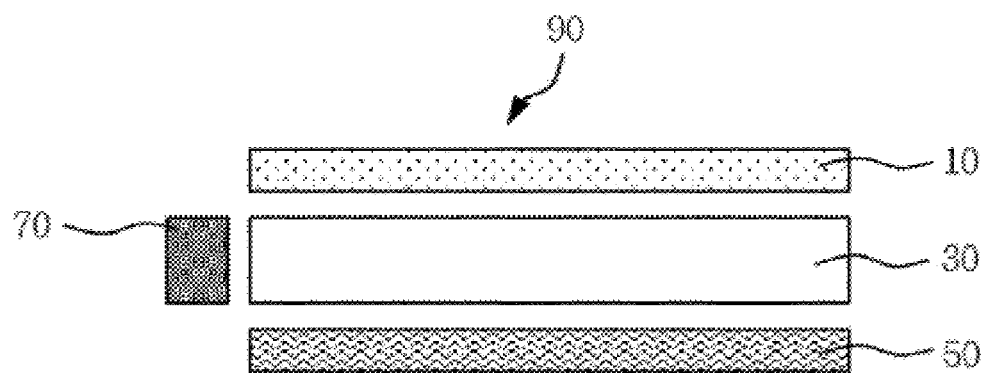
FIG. 3 is a view showing a configuration of a backlight unit including a color conversion sheet according to an embodiment of the present invention.

FIG. 3 is a view showing a configuration of a backlight unit including a color conversion sheet according to an embodiment of the present invention.

Referring to FIG. 3, a backlight unit 90 according to one embodiment of the present invention may include a light source 70, a reflective plate 50 which can increase light efficiency by reflecting light emitted from the light source 70, a light guide plate 30 which is located above the reflective plate 50 and serves to evenly spread the light emitted from the light source 70, and a color conversion sheet 10 positioned above the light guide plate 30.

Although the edge-type light source 70 is illustrated in FIG. 3 for convenience, the light source 70 is not limited thereto, and the light source 70 may be applied in various types, such as a side chain type or a direct-lit type.

In addition, the same color conversion sheet as described in the embodiment shown in FIG. 1 or 2 may be used as the color conversion sheet 10, and thus a redundant description of the color conversion sheet 10 will be omitted.

Additionally, at least one optical sheet, for example, a diffusion sheet, a prism sheet, and a double brightness enhancement film (DBEF) may be further provided on an upper portion of the color conversion sheet 10.

Hereinafter, the configuration of the present invention and effects thereof will be described in more detail through Examples and Comparative Examples. However, the following examples are provided to illustrate further the present invention and are not intended to limit the scope of the present invention.

EXAMPLES

Example 1

Two organic phosphor solutions were prepared by dissolving respectively a green organic phosphor and a red organic phosphor according to the following Formulas 1 and 2 in methyl ethyl ketone with a Hildebrand solubility parameter of 19.3 MPa$^{1/2}$.

[Formula 1]

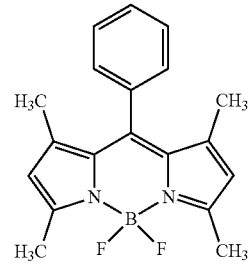

[Formula 2]

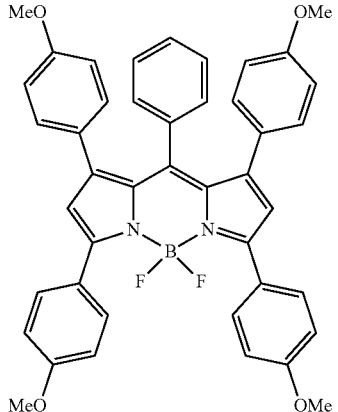

Prepared two organic phosphor solutions were mixed with poly(methyl) methacrylate (Sigma-Aldrich) with a Hildebrand solubility parameter of 19.0 MPa$^{1/2}$, followed by the addition of methyl ethyl ketone with a Hildebrand solubility parameter of 19.3 MPa$^{1/2}$ to achieve a viscosity of 150 cps. Thereafter, the mixture was stirred at 150 rpm for 30 minutes to prepare a composition for a wavelength conversion layer. At this time, the green organic phosphor was set to be 0.75 parts by weight based on 100 parts by weight of the solid content of poly(methyl) methacrylate resin, and the red organic phosphor was set to 0.015 parts by weight based on 100 parts by weight of the solid content of poly(methyl) methacrylate resin.

The composition for a wavelength conversion layer was bar-coated onto an upper surface of a polyethylene terephthalate (PET) film (TAK, PL8) and then dried at 140° C. for 2 minutes to prepare a wavelength conversion layer having a thickness of 20 μm.

Next, 5 parts by weight of polyvinyl alcohol (Daejung Chemicals & Metals) with a Hildebrand solubility parameter of 30.5 MPa$^{1/2}$ was added to 100 parts by weight of distilled water with a Hildebrand solubility parameter of 48.0 MPa$^{1/2}$, followed by stirring at 65° C. for 1 hour to prepare a composition for a phosphor diffusion barrier layer.

Thereafter, the composition for a phosphor diffusion barrier layer was bar-coated onto an upper surface of the wavelength conversion layer and then dried at 140° C. for 2 minutes to prepare a phosphor diffusion barrier layer having a thickness of 0.2 µm.

A composition for an adhesive layer was prepared by adding 20 parts by weight of toluene to 100 parts by weight of an acrylic-based resin (Samwon Co., Ltd, AT-2100) and stirring for 30 minutes. The composition for an adhesive layer thus prepared was bar-coated onto the opposite surface of a diffusion layer of a diffusion film (TAK, TDF12C) and dried at 140° C. for 2 minutes to prepare an adhesive layer having a thickness of 10 µm.

After laminating the adhesive layer and the phosphor diffusion barrier layer thus prepared to be in contact with each other, a color conversion sheet was prepared using a roll laminator (GMP, EXCELAM II-355Q).

Example 2

A color conversion sheet was prepared in the same manner as in Example 1, except that a composition for a phosphor diffusion barrier layer was prepared by adding 20 parts by weight of polydimethylsiloxane (DOW) with a Hildebrand solubility parameter of 15.3 MPa$^{1/2}$ to 100 parts by weight of heptane with a Hildebrand solubility parameter of 15.3 MPa$^{1/2}$ and then stirring the mixture for 3 hours.

Example 3

A color conversion sheet was prepared in the same manner as in Example 2, except that cyclohexane with a Hildebrand solubility parameter of 16.8 MPa$^{1/2}$, instead of heptan, was used in a composition for a phosphor diffusion barrier layer.

Example 4

The green organic phosphor solution and the red organic phosphor solution prepared in Example 1 were separately mixed with a resin in which poly(methyl) methacrylate (Sigma-Aldrich) was dissolved in methyl ethyl ketone. Thereafter, methyl ethyl ketone was added to each mixture to achieve a viscosity of 150 cps, and then the mixtures were stirred at 150 rpm for 30 minutes to prepare a composition for a green wavelength conversion layer and a composition for a red wavelength conversion layer.

At this time, the green organic phosphor was set to be 0.36 parts by weight based on 100 parts by weight of the solid content of poly(methyl) methacrylate resin, and the red organic phosphor was set to 0.03 parts by weight based on 100 parts by weight of the solid content of poly(methyl) methacrylate resin.

Next, the composition for a green wavelength conversion layer was bar-coated onto the upper surface of a PET film (TAK, PL8) and then dried at 140° C. for 2 minutes to prepare a green wavelength conversion layer having a thickness of 20 µm. The composition for a red wavelength conversion layer was bar-coated onto the opposite surface of a diffusion film (TAK, TDF12C), and then dried at 140° C. for 2 minutes to prepare a red wavelength conversion layer having a thickness of 20 µm.

Also, the composition for a phosphor diffusion barrier layer of Example 1 was bar-coated onto the upper surface of each of the green and red wavelength conversion layers, and then dried at 140° C. for 2 minutes to prepare a phosphor diffusion barrier layer having a thickness of 0.2 µm.

Thereafter, the composition for an adhesive layer of Example 1 was bar-coated on the upper surface of the phosphor diffusion barrier layer formed on one surface of the red wavelength conversion layer, and then dried for 140° C. for 2 minutes to prepare an adhesive layer having a thickness of 10 µm. Afterwards, the adhesive layer and the green wavelength conversion layer were laminated so that the upper surface of the adhesive layer was in contact with an upper surface of the phosphor diffusion barrier layer formed on one surface of the green wavelength conversion layer, and then a color conversion sheet was prepared using a roll laminator (GMP, EXCELAM II-355Q).

COMPARATIVE EXAMPLE

Comparative Example 1

A color conversion sheet was prepared in the same manner as in Example 1, except that the process of forming the phosphor diffusion barrier layer was omitted and the adhesive layer and the wavelength conversion layer were laminated to be in contact with each other.

Comparative Example 2

A color conversion sheet was prepared in the same manner as in Example 2, except that toluene with a Hildebrand solubility parameter of 18.3 MPa$^{1/2}$, instead of heptan, was used in the composition for a phosphor diffusion barrier layer.

Comparative Example 3

A color conversion sheet was prepared in the same manner as in Example 2, except that xylene with a Hildebrand solubility parameter of 18.2 MPa$^{1/2}$, instead of heptan, was used in the composition for a phosphor diffusion barrier layer.

Comparative Example 4

A color conversion sheet was prepared in the same manner as in Example 1, except that a composition for a phosphor diffusion barrier layer was prepared by adding 20 parts by weight of poly(methyl) methacrylate (Sigma-Aldrich) with a Hildebrand solubility parameter of 19.0 MPa$^{1/2}$ to 100 parts by weight of toluene with a Hildebrand solubility parameter of 18.3 MPa$^{1/2}$, instead of polyvinyl alcohol and distilled water.

Table 1 shows differences in Hildebrand solubility parameter between the wavelength conversion layer and the phosphor diffusion barrier layer for Examples 1 to 4 and Comparative Examples 2 to 4. Comparative Example 1 had the phosphor diffusion barrier layer omitted and is excluded from Table 1.

TABLE 1

| | Hildebrand solubility parameter (MPa$^{1/2}$) | | | | | |
|---|---|---|---|---|---|---|
| | Wavelength conversion layer | | Phosphor diffusion barrier layer | | Difference in solubility | |
| | P1 | S1 | P2 | S2 | \|P1-S2\| | \|P1-P2\| |
| Example 1 | 19.0 | 19.3 | 30.5 | 48.0 | 29.0 | 11.5 |
| Example 2 | 19.0 | 19.3 | 15.3 | 15.3 | 3.7 | 3.7 |
| Example 3 | 19.0 | 19.3 | 15.3 | 16.8 | 2.2 | 3.7 |
| Example 4 | 19.0 | 19.3 | 30.5 | 48.0 | 29.0 | 11.5 |
| Comparative Example 2 | 19.0 | 19.3 | 15.3 | 18.3 | 0.7 | 3.7 |
| Comparative Example 3 | 19.0 | 19.3 | 15.3 | 18.2 | 0.8 | 3.7 |
| Comparative Example 4 | 19.0 | 19.3 | 19.0 | 18.3 | 0.7 | 0 |

As shown in Table 1, it can be observed that in all Examples 1 to 4, the difference in solubility parameters according to Equations 1 and 2 exceeded 2 MPa$^{1/2}$, confirming the fulfillment of the conditions of Equations 1 and 2. Conversely, Comparative Examples 2 and 3 had a solubility parameter difference according to Equation 1 of less than 1 MPa$^{1/2}$, thus failing to meet the condition of Equation 1. Similarly, in Comparative Example 4, the difference in solubility parameters according to Equations 1 and 2 was less than 2 MPa$^{1/2}$, resulting in a failure to satisfy the condition of Equation 2.

The physical properties of the color conversion sheets prepared as described above for Examples 1 to 4 and Comparative Examples 1 to 4 were measured and evaluated according to the following Experimental Example.

Experimental Example (1) Measurement of Luminance and Color Coordinate Change

After measuring the initial luminance (L) and color coordinates (x, y) values of the color conversion sheets of Examples 1 to 4 and Comparative Examples 1 to 4, the color coordinate change (Δx, Δy) and luminance change (ΔLv) over time under the condition of 70° C. were measured using a spectroradiometer (KONICA MINOLTA, CA-S20W).

At this time, the color conversion sheet was laminated on an upper surface of a light guide plate of the backlight unit including a blue LED with a wavelength of 450 nm and the light guide plate, a prism sheet was additionally laminated on an upper surface of the color conversion sheet, and then the experiment was conducted.

Below is a table showing the results of performing the experiment on the color conversion sheet according to the above-described Experimental Example.

Below is Table 2 showing results of measuring the luminance and color coordinate change for Examples 1 to 4 and Comparative Examples 1 to 4.

TABLE 2

| | | High temperature treatment time | | |
|---|---|---|---|---|
| | | 0 Hr | 240 Hr | 480 Hr |
| Example 1 | ΔL (measured value/ initial value) | 100% | 100.4% | 99.8% |
| | Δx, Δy (measured value- initial value) | 0, 0 | +0.0005, +0.0007 | −0.0001, +0.0001 |
| Example 2 | ΔL (measured value/ initial value) | 100% | 101.1% | 100.3% |
| | Δx, Δy (measured value- initial value) | 0, 0 | +0.0008, +0.0012 | +0.0002, +0.0004 |
| Example 3 | ΔL (measured value/ initial value) | 100% | 100.6% | 100.2% |
| | Δx, Δy (measured value- initial value) | 0, 0 | +0.0005, +0.0010 | +0.0002, +0.0005 |
| Example 4 | ΔL (measured value/ initial value) | 100% | 102.8% | 102.2% |
| | Δx, Δy (measured value- initial value) | 0, 0 | +0.0012, +0.0020 | +0.0010, +0.0014 |
| Comparative Example 1 | ΔL (measured value/ initial value) | 100% | 97.2% | 94.3% |
| | Δx, Δy (measured value- initial value) | 0, 0 | −0.0015, −0.0080 | −0.0025, −0.0113 |
| Comparative Example 2 | ΔL (measured value/ initial value) | 100% | 98.4% | 96.9% |
| | Δx, Δy (measured value- initial value) | 0, 0 | −0.0011, −0.0061 | −0.0018, −0.0083 |
| Comparative Example 3 | ΔL (measured value/ initial value) | 100% | 97.9% | 95.4% |
| | Δx, Δy (measured value- initial value) | 0, 0 | −0.0013, −0.0076 | −0.0022, −0.0104 |
| Comparative Example 4 | ΔL (measured value/ initial value) | 100% | 95.2% | 93.4% |
| | Δx, Δy (measured value- initial value) | 0, 0 | −0.0021, −0.0110 | −0.0035, −0.0147 |

As shown in Table 2 above, Examples 1 to 4, which satisfied Equations 1 and 2 with respect to the difference in solubility parameters between the wavelength conversion layer and the phosphor diffusion barrier layer, exhibited color coordinate changes within +0.0015 on both the x-axis and y-axis even after 480 hours of treatment at 70° C. In contrast, Comparative Example 1, which is a color conversion sheet prepared by directly laminating an adhesive layer without forming a phosphor diffusion barrier layer, showed the largest color coordinate changes with x-axis variation of −0.0025 and y-axis variation of −0.0113 among all Examples and Comparative Examples.

Comparative Examples 2 and 3, which did not satisfy Equation 1 with respect to the difference in solubility parameters between the wavelength conversion layer and the phosphor diffusion barrier layer, exhibited greater color coordinate changes compared to Examples 1 to 4. Similarly, Comparative Example 4, which did not satisfy Equations 1 and 2, showed even greater color coordinate changes compared to Examples 1 to 4. In other words, it was observed that Comparative Examples 2 to 4 with surface energies of the wavelength conversion layer and adhesive layer not satisfying Equations 1 or 2 exhibited greater color coordinate changes than Examples 1 to 4, where the surface energies of the wavelength conversion layer and adhesive layer satisfied Equations 1 and 2.

In addition, Examples 1 to 4 exhibited a luminance change of less than 2.5% after 480 hours of treatment, especially showing a change of less than 1% after 240 hours of treatment. On the other hand, Comparative Example 1, which is a color conversion sheet in which an adhesive layer was directly laminated without forming a phosphor diffusion barrier layer, exhibited a gradual decrease in luminance, resulting in a luminance change of 5.7% after 480 hours of treatment, and Comparative Examples 2 to 4, which did not satisfy Equation 1 or 2 in the difference in solubility parameters between the wavelength conversion layer and the phosphor diffusion barrier layer, exhibited a gradual decrease in luminance, resulting in luminance changes ranging from 3.1% to 4.6% after 480 hours of treatment.

As mentioned above, as in Comparative Example 1, in the case of the color conversion sheet where a phosphor diffusion barrier layer was not formed and an adhesive layer was directly laminated, and as in Comparative Examples 2 to 4, in the case that the difference in solubility parameters between the wavelength conversion layer and the phosphor diffusion barrier layer did not satisfy Equation 1 or 2, significant color change and luminance change occurred under high-temperature conditions. Conversely, when the difference in solubility parameters between the wavelength conversion layer and the phosphor diffusion barrier layer satisfied Equation 1 and 2, minimal color and luminance changes were observed even under high-temperature conditions.

The color conversion sheet according to the present invention as described above prevents the deterioration of organic phosphors within the wavelength conversion layer due to the chemical functional groups of the adhesive layer or residual solvents by additionally forming a phosphor diffusion barrier layer that prevents the diffusion of the organic phosphors. In addition, simultaneously organic phosphors detached from the interface of the wavelength conversion layer over time is prevented from diffusing into the adhesive layer in an environment of high-temperature or high-temperature and high humidity, thus addressing problems of changes in luminance characteristics and color change due to change in luminous efficiency and deterioration of organic phosphors. Furthermore, by using a difference in solubility parameters between the wavelength conversion layer and the phosphor diffusion barrier layer, the phosphor diffusion barrier layer is prevented from being mixed with the wavelength conversion layer upon lamination, or diffusion of the organic phosphors from the wavelength conversion layer into the phosphor diffusion barrier layer over time is prevented, which may occur due to the influence of residual solvents under high temperature or high temperature/high humidity conditions. Accordingly, problems related to changes in luminance characteristics and color change may be solved.

While the present invention has been particularly shown and described with reference to exemplary embodiments thereof, it will be understood by those of ordinary skill in the art that various changes in form and details may be made therein without departing from the spirit and scope of the present invention as defined by the following claims.

REFERENCE NUMERALS 10, 100: COLOR CONVERSION SHEET
20: WAVELENGTH CONVERSION LAYER
13: ORGANIC PHOSPHOR
19: RESIN MATRIX
22: PHOSPHOR DIFFUSION BARRIER LAYER
22-1: FIRST PHOSPHOR DIFFUSION BARRIER LAYER
22-2: SECOND PHOSPHOR DIFFUSION BARRIER LAYER
24: ADHESIVE LAYER
17, 17A, 17B: SUBSTRATE
201: FIRST WAVELENGTH CONVERSION LAYER
202: SECOND WAVELENGTH CONVERSION LAYER
30: LIGHT GUIDE PLATE
50: REFLECTIVE PLATE
70: LIGHT SOURCE
90: BACKLIGHT UNIT

What is claimed is:

1. A color conversion sheet comprising:
a first wavelength conversion layer in which an organic phosphor is dispersed in a resin matrix;
a first phosphor diffusion barrier layer positioned on one surface of the first wavelength conversion layer; and
an adhesive layer positioned on one surface of the first phosphor diffusion barrier layer,
wherein the first phosphor diffusion barrier layer is formed from a composition containing a solvent having a Hildebrand solubility parameter according to Equation 1 below:

$$|P1-S2|>2 \text{ MPa}^{1/2} \quad \text{(Equation 1)}$$

P1: Hildebrand solubility parameter of the resin matrix of the first wavelength conversion layer
S2: Hildebrand solubility parameter of the solvent included in the first phosphor diffusion barrier layer.

2. The color conversion sheet of claim 1, wherein the first phosphor diffusion barrier layer further comprises a thermosetting or thermoplastic organic compound that has a Hildebrand solubility parameter according to Equation 2 below:

$$|P1-P2|>2 \text{ MPa}^{1/2} \quad \text{(Equation 2)}$$

P1: Hildebrand solubility parameter of the resin matrix of the first wavelength conversion layer
P2: Hildebrand solubility parameter of the organic compound included in the first phosphor diffusion barrier layer.

3. The color conversion sheet of claim 1, wherein a thickness of the first phosphor diffusion barrier layer is 0.01 to 10 µm.

4. The color conversion sheet of claim 1, having a color coordinate change on both x-axis and y-axis within +0.0015 after treatment for 480 hours at 70° C.

5. The color conversion sheet of claim 1, wherein the resin matrix contains at least one of an ester-based resin, an olefin-based resin, an acrylic-based resin, an ether-based resin, an urethane-based resin, a carbonate-based resin, or an imide-based resin.

6. The color conversion sheet of claim 1, wherein the resin matrix has a glass transition temperature of 50 to 140° C.

7. The color conversion sheet of claim 1, wherein the organic phosphor of the first wavelength conversion layer does not migrate into the phosphor diffusion barrier layer.

8. The color conversion sheet of claim 1, wherein the first phosphor diffusion barrier layer has a visible light transmittance of 70% or more.

9. The color conversion sheet of claim 1, further comprising a substrate positioned on at least one surface of the first wavelength conversion layer or the adhesive layer.

10. The color conversion sheet of claim 1, further comprising:
a second phosphor diffusion barrier layer positioned on the adhesive layer; and a second wavelength conversion layer positioned on the second phosphor diffusion barrier layer and having an organic phosphor dispersed in a resin matrix.

11. The color conversion sheet of claim 10, wherein the second wavelength conversion layer contains an organic phosphor having the same or different color as that of the organic phosphor dispersed in the first wavelength conversion layer.

12. The color conversion sheet of claim 10, wherein the second phosphor diffusion barrier layer is formed from a composition containing a solvent having a Hildebrand solubility parameter according to Equation 1 below:

$$|P1-S2|>2 \text{ MPa}^{1/2} \quad \text{(Equation 1)}$$

P1: Hildebrand solubility parameter of the resin matrix of the second wavelength conversion layer S2: Hildebrand solubility parameter of the solvent included in the second phosphor diffusion barrier layer.

13. The color conversion sheet of claim 10, wherein the second phosphor diffusion barrier layer further comprises a thermosetting or thermoplastic organic compound that has a Hildebrand solubility parameter according to Equation 2 below:

$$|P1-P2|>2 \text{ MPa}^{1/2} \quad \text{(Equation 2)}$$

P1: Hildebrand solubility parameter of the resin matrix of the second wavelength conversion layer P2: Hildebrand solubility parameter of the organic compound included in the second phosphor diffusion barrier layer.

14. A backlight unit comprising the color conversion sheet according to claim 1.

\* \* \* \* \*